United States Patent
Eskridge

(10) Patent No.: US 7,420,817 B2
(45) Date of Patent: Sep. 2, 2008

(54) MEMS DEVICE SEAL USING LIQUID CRYSTAL POLYMER

(75) Inventor: Mark H. Eskridge, Renton, WA (US)

(73) Assignee: Honeywell International Inc., Morristown, NJ (US)

( * ) Notice: Subject to any disclaimer, the term of this patent is extended or adjusted under 35 U.S.C. 154(b) by 419 days.

(21) Appl. No.: 11/328,992

(22) Filed: Jan. 9, 2006

(65) Prior Publication Data
US 2007/0159803 A1 Jul. 12, 2007

(51) Int. Cl.
H05K 7/00 (2006.01)

(52) U.S. Cl. ........................ 361/760; 361/783; 361/748; 361/790; 361/807; 257/777; 257/778; 174/541

(58) Field of Classification Search ......... 361/760–767, 361/770, 771, 777, 783, 790, 807; 257/684, 257/415, 682, 704, 777, 681, 728–730; 200/181, 200/572; 174/541
See application file for complete search history.

(56) References Cited

U.S. PATENT DOCUMENTS

| | | | |
|---|---|---|---|
| 4,023,562 A * | 5/1977 | Hynecek et al. ............. 600/561 |
| 5,248,530 A | 9/1993 | Jester et al. | |
| 5,280,413 A * | 1/1994 | Pai ............................... 361/792 |
| 5,591,679 A * | 1/1997 | Jakobsen et al. ............... 438/51 |
| 5,650,593 A | 7/1997 | McMillan et al. | |
| 5,719,354 A | 2/1998 | Jester et al. | |
| 5,789,042 A | 8/1998 | Jester et al. | |
| 5,827,999 A | 10/1998 | McMillan et al. | |
| 6,414,849 B1 | 7/2002 | Chiu | |
| 6,560,121 B1 * | 5/2003 | Daden et al. ................. 361/760 |
| 6,784,530 B2 | 8/2004 | Sugaya et al. | |
| 6,808,955 B2 * | 10/2004 | Ma ................................ 438/51 |
| 6,906,395 B2 * | 6/2005 | Smith ........................... 257/417 |
| 6,949,807 B2 | 9/2005 | Eskridge et al. | |
| 2005/0205951 A1 * | 9/2005 | Eskridge ..................... 257/416 |

* cited by examiner

*Primary Examiner*—Dean A. Reichard
*Assistant Examiner*—Hoa C Nguyen

(57) ABSTRACT

An apparatus and method for a near hermetic chip carrier package having a base die and a lid die each formed of a substantially impermeable material and conjoined by a semi-permeable sheet or tape substrate of only a few thousands of an inch thickness that is formed of two or more thermotropic liquid crystal polymer (LCP) films laminated over a selected number of metal electrical conductors carrying signals into and out of package.

20 Claims, 3 Drawing Sheets ded. Use of LCP causes TE
MEMS DEVICE SEAL USING LIQUID CRYSTAL POLYMER

FIELD OF THE INVENTION

The present invention relates to apparatus and methods for packaging of electronics devices, and in particular to hermetic sealing of Micro Electro-Mechanical System (MEMS) sensor and actuator devices.

BACKGROUND OF THE INVENTION

Modern accelerometers, pressure transducers, and similar transducers are often fabricated as Micro Electro-Mechanical System (MEMS) sensor and actuator devices. It is conventional in the electronic industry to encapsulate such MEMS device mechanisms in chip carrier packages. Chip carrier packages usually seal a semiconductor or MEMS sensor device chip within insulative plastics or resins. This protects the chip from environmental hazards as well as providing a means for electrically and mechanically attaching the chip to an intended device. A primary focus in the design of such a chip carrier package is to provide the chip with adequate protection from the external environment during handling and operation.

Ceramic and metal chip carrier packages are considered hermetic. However, chip carrier package include designs for total encasement chip carrier packages, commonly referred to as "TE packages." The TE package generally includes a lead frame having a chip mounting pad, an integrated circuit chip which is attached to the chip mounting pad, a plurality of fragile wires which connect the chip to the lead frame, and a thermoset plastic which totally encases the lead frame, the chip and the plurality of fragile wires. It may also include a heat sink (HS) or similar heat dissipation means.

Thermotropic liquid crystal polymers, such as polyesters and combinations of different polyesters, commonly referred to as LCP, are the thermoplastic materials often used in the electronics industry for TE packaging. When used as a TE package, LCP is usually used as the body of the package, the "bathtub," to which a glass, ceramic or metal lid is sealed by heating the LCP until it melts and flows to produce a bond between the LCP and the lid.

LCP is also the thermoplastic material often used in electronics packaging for flex tape substrates where a metal electrical conductor (e.g., copper, aluminum, silver, and the like) is co-extruded with LCP film or sheet to form an LCP film suitable for multilayer laminates, e.g., circuit boards. The LCP is heated until it melts and flows to produce a bond between the LCP and metal laminated layers. Signals come out of the TE package on metal electrical conductors between laminated layers of LCP. As a result, the majority of the package is LCP.

In contrast to glass, ceramic and metal, LCP materials are generally considered semi-permeable. Use of LCP causes TE packages to be only semi-hermetic, even when sealed with a glass, ceramic or metal lid. LCP material is not nearly as permeable as most plastics, and so can be a suitable chip carrier package for many electronic and MEMS devices. Some MEMS sensors previously thought to require fully hermetic packages are now produced with semi-hermetic packages, especially in commercial and automotive applications. However, some MEMS sensor and actuator devices are still limited to hermetically sealed chip carrier packages.

SUMMARY OF THE INVENTION

The present invention is an apparatus and method for overcoming limitations of the prior art by providing a near hermetic chip carrier package using two die both formed of substantially impermeable glass, ceramic, silicon or metal material. At least one electrical conductor is provided on a mounting surface of the first die and extends between a contact pad at a first end that is positioned in a first interior portion of the mounting surface, and another contact pad at a second end thereof that is positioned at a second interior portion of the mounting surface remote from the first interior portion. A thermoplastic substrate is formed having a window in a position substantially corresponding to the first interior portion of the mounting surface of the first die. The thermoplastic substrate is bonded between the mounting surface of the first die and an opposing surface of the second die with the window completely surrounding the first interior portion of the mounting surface of the first die. The thermoplastic substrate thus forms a substantially sealed cavity between the mounting surface of the first die and the opposing surface of the second die and completely surrounding the first interior portion of the mounting surface of the first die. A portion of the thermoplastic substrate also forms a surface at a position that is external to the first and second die. At least one second electrical conductor extends between a contact pad at a first end that is positioned on the surface of the substrate external of the first and second die, and a contact pad at a second end that is coupled to the second end of the first electrical conductor.

According to one aspect of the invention, the second interior portion of the mounting surface of the first die is positioned remotely from the first interior portion thereof According to another aspect of the invention, the package of the invention also includes a flip chip connection that couples the contact pad at the second end of the second electrical conductor and the contact pad at the second end of the first electrical conductor.

According to another aspect of the invention, the package of the invention also includes a sealed cavity in a position corresponding to the flip chip connection between the contact pad at the second end of the second electrical conductor and the contact pad at the second end of the first electrical conductor.

According to another aspect of the invention, the thermoplastic substrate is a substrate formed of a thermotropic liquid crystal polymer (LCP). For example, the thermoplastic substrate is a substrate formed of two or more thermotropic liquid crystal polymer (LCP) films laminated over at least a portion of the second electrical conductor extending between the contact pad at the first end and the contact pad at the second end.

According to another aspect of the invention, the surface of the substrate that is external of the first and second die is formed by a surface a second one of the thermotropic liquid crystal polymer (LCP) films that is exposed by a window formed in a first one of the films.

According to another aspect of the invention, the package of the invention also includes a micro electromechanical system (MEMS) device mechanism that is positioned within the sealed cavity and attached to the contact pad at the first end of the first electrical conductor.

According to another aspect of the invention, the sealed cavity having the ME MS device mechanism sealed therein includes another cavity formed in the surface of the second die opposite from the first interior portion of the mounting surface of the first die where the MEMS device mechanism is attached.

According to yet another aspect of the invention, the surface area of the LCP substrate able to pass atmosphere in the package of the invention is limited to a tiny circumferential edge as compared to the "bathtub" configuration of prior art LCP packages. The package of the invention is also overall much smaller than the "bathtub" configuration of prior art LCP packages.

According to still other aspects of the invention, methods are provided for fabricating a near hermetic chip carrier package of the invention.

These and other aspects of the invention are detailed herein.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The Figures illustrate the apparatus and method of the present invention for a detector drive circuit for operation of a differential capacitance transducer device having novel null bias trimming.

Figure 1:
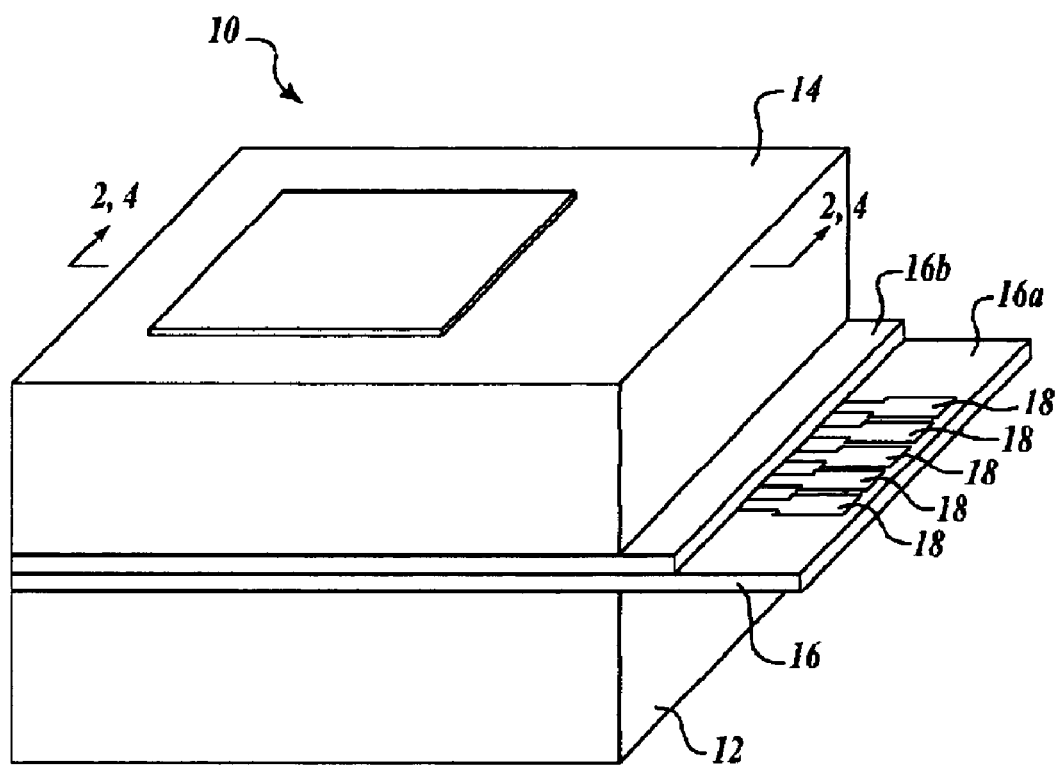
FIG. 1 illustrates the apparatus and method of the invention by example and without limitation as a near hermetic chip carrier package.

FIG. 1 illustrates the apparatus and method of the invention by example and without limitation as a near hermetic chip carrier package 10 having a base die or wafer 12 and a lid die or wafer 14 each formed of a substantially impermeable material and conjoined by a semi-permeable sheet or tape substrate 16 of only a few thousands of an inch thick that is formed of two or more thermotropic liquid crystal polymer (LCP) films 16a, 16b laminated over a selected number of metal electrical conductors 18 carrying signals into and out of package 10.

Figure 2:
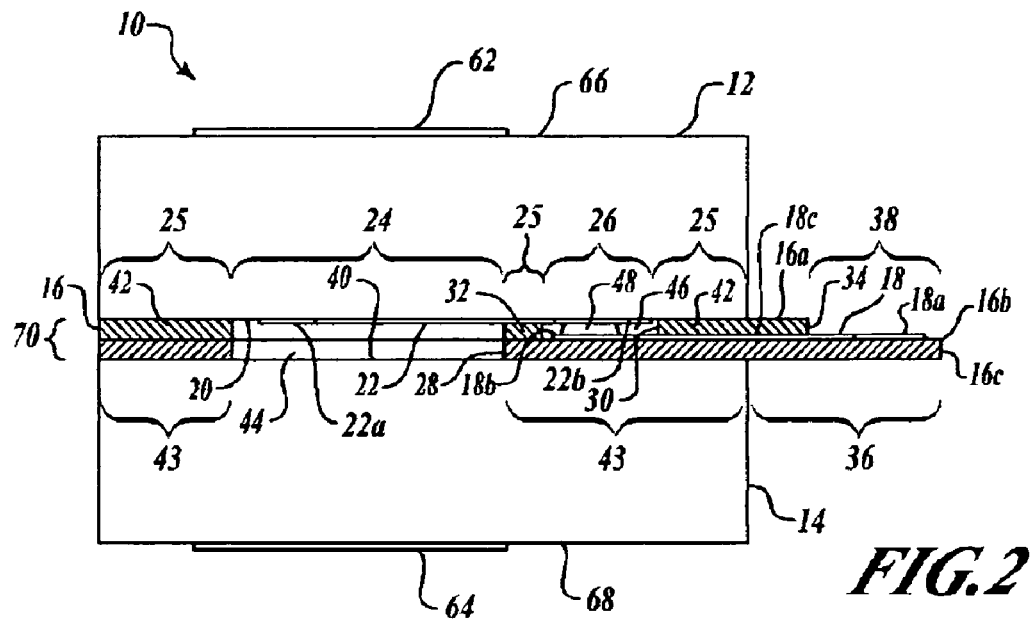
FIG. 2 is a cross-sectional view of the near hermetic chip carrier package of the invention illustrated in FIG. 1.

FIG. 2 is a cross-sectional view of the near hermetic chip carrier package 10 of the invention showing the base and lid die 12, 14 conjoined by the sheet or tape substrate 16 of LCP films 16a, 16b laminated over metal electrical conductors 18 for carrying signals into and out of package 10. As is generally well known in the art, glass, ceramic, silicon and metal die materials are generally impermeable so that chip carrier packages fabricated of such die materials are generally considered to be hermetic. In contrast, LCP materials are known to be semi-permeable so that conventional TE packages using LCP materials are semi-permeable, even when sealed with a glass, ceramic or metal lid, because the majority of the package is the semi-permeable LCP material. Therefore, according to the present invention, the base and lid die 12, 14 are both formed of a substantially impermeable material, such as glass, ceramic, silicon and metal. For example, the base and lid die 12, 14 are both formed of silicon or glass selected as a function of which material is used in fabrication of a micro electromechanical system (MEMS) sensor or actuator device mechanism to be carried on the near hermetic chip carrier package 10 of the invention.

A substantially smooth and planar mounting surface 20 of base die 12 is patterned with an electrically conductive material, such as copper, aluminum, silver, gold metal and the like, to form one or more device mechanism electrical signal paths embodied as electrical conductors or traces 22. The electrical traces 22 are provided within an MEMS device mechanism mounting surface area or zone 24 positioned interior of the base die mounting surface 20, which is completely surrounded by a peripheral bonding surface area or zone 25. One or more of the metal electrical traces 22 extend into an electrical interconnect area or zone 26 of the base die mounting surface 20 remote from the MEMS device mechanism mounting surface zone 24. The electrical interconnect zone 26 is positioned interior of the base die mounting surface 20 adjacent to but spaced away from MEMS device mechanism mounting surface zone 24. Each of the electrical traces 22 has a device mechanism contact pad 22a within the MEMS device mechanism mounting surface zone 24, and one or more of the electrical traces 22 has a package contact pad 22b within the electrical interconnect zone 26.

Electrical conductors 22 are alternatively formed as buried diff-used conductors doped by ion implantation, as described in U.S. Pat. No. 6,906,395, HERMETICALLY SEALED SILICON MICRO-MACHINED ELECTROMECHANICAL SYSTEM (MEMS) DEVICE HAVING DIFFUSED CONDUCTORS, the complete disclosure of which is incorporated herein by reference. Accordingly, the electrical conductors 22 are formed as buried diff-used conductors coupled via contact diffusions to the metal interconnection areas. Optionally, the diffused conductors are buried under an epitaxial layer and are electrically coupled to the metal interconnection areas 22a, 22b via contact diffusions and contact holes in a passivation layer, as described in U.S. Pat. No. 5,591,679, SEALED CAVITY ARRANGEMENT METHOD, the complete disclosure of which is incorporated herein by reference. Signal routing is alternatively accomplished by means of electrical traces in combination with pillars of semiconductor silicon and corresponding cover plate windows as disclosed in U.S. Pat. No. 6,949,807, SIGNAL ROUTING IN A HERMETICALLY SEALED MEMS DEVICE, the complete disclosure of which is incorporated herein by reference.

A first device mechanism window 28 is cut or otherwise formed through the sheet or tape substrate 16 of LCP films 16a, 16b. The window 28 is positioned at an interior portion of the LCP substrate 16 corresponding to the MEMS device mechanism mounting surface area or zone 24 of the base die mounting surface 20. A second electrical interconnect window 30 is cut or otherwise formed in a first one of the LCP films 16a (shown) or 16b of sheet or tape substrate 16 and exposing a surface 31 of the second one of the LCP films 16b (shown) or 16a. The electrical interconnect window 30 is positioned at an interior portion of the LCP substrate 16 corresponding to the electrical interconnect area or zone 26 of the base die mounting surface 20. The electrical interconnect window 30 is adjacent to but spaced away from device mechanism window 28. Furthermore, the device mechanism and electrical interconnect windows 28 and 30 are mutually isolated by a barrier or dam 32 formed by a strip of the LCP film 16a interposed between the two windows 28 and 30.

A third package interconnect window 34 is cut or otherwise formed in one of the LCP films 16a (shown) or 16b at an exterior portion 36 of the LCP substrate 16 that lies outside an outline of the base and lid die 12, 14. For example, the third package interconnect window 34 is positioned at or near an edge 16c of sheet or tape substrate 16. The package interconnect window 34 is optionally formed by cutting the LCP film 16a (shown) or 16b short of the edge 36 of sheet or tape substrate 16. The package interconnect window 34 exposes a shelf 38 of the second LCP film 16b (shown) or 16a adjacent to the film edge 36.

The metal electrical conductors 18 laminated within the LCP substrate 16 between the LCP films 16a, 16b extend between the second electrical interconnect window 30 and the third package interconnect window 34. The package interconnect window 34 exposes at least a package interconnect pad 18a portion of each of the metal electrical conductors 18 laminated to the exposed shelf 38 of the second LCP film 16b. A device mechanism electrical interconnect pad 18b is formed at an opposite end of an elongated interconnect portion 18c of each of the electrical conductors 18 from the package interconnect pads 18a. The ends of the electrical conductors 18 having the package interconnect pads 18a extend into the electrical interconnect window 30 in the LCP film 16b. The package interconnect pads 18a are placed in complementary positions that correspond to the package contact pads 22b at the ends of the electrical traces 22 in the electrical interconnect zone 26 of the base die mounting surface 20. Accordingly, the complementary device mechanism electrical interconnect pad 18b and corresponding package contact pads 22b overlap in opposing positions within the electrical interconnect window 30 in the LCP film 16a being spaced-apart by the thickness of the LCP film 16a.

The base and lid die 12, 14 are thermocompression bonded together through lamination with the LCP substrate 16. For example, the smooth and planar mounting surface 20 of the base die 12 is brought together with a complementary substantially smooth and planar opposing surface 40 of the lid die 14 with the LCP substrate 16 in between. A window frame portion 42 of the LCP substrate 16 formed of all the LCP films 16a, 16b extends continuously around the first device mechanism window 28 within the bonding zone 25 of the base die 12 and a complementary bonding zone portion 43 of the opposing surface 40 of the lid die 14. The window frame portion 42 of the LCP substrate 16 thus completely surrounds and seals the first device mechanism window 28 between the base and lid die 12, 14. By sealing the first device mechanism window 28 the window frame 42 of LCP substrate material forms a first nearly hermetic device mechanism cavity 44 between the base and lid die 12, 14 and within the confines of the LCP material window frame 42. The base and lid die 12, 14 are of substantially impermeable materials such as glass, ceramic, silicon or metal and are interrupted only by the thin layer of a few thousands of an inch of semi-permeable LCP substrate 16 joining them. The semi-permeable LCP substrate 16 is exposed only for a very small cross-sectional area between the substantially impermeable base and lid die 12, 14, and the LCP material substrate 16 is not nearly as permeable as most plastics, so that the device mechanism cavity 44 is nearly hermetic within the chip carrier package 10.

The second electrical interconnect window 30 in the first one of the LCP films 16a of sheet or tape substrate 16 forms a second nearly hermetic electrical interconnect cavity 46 between the base lid die 14 (shown) or the lid die 12 and the second one of the LCP films 16b. This second nearly hermetic cavity 46 is spaced-apart and mutually isolated from the first device mechanism cavity 44 by the barrier or dam 32 strip of the LCP film 16a interposed between the device mechanism and electrical interconnect windows 28 and 30. The barrier or dam 32 strip of the first LCP film 16a thus combines with the second LCP film 16b to form a sub-portion of the window frame portion 42 of the LCP substrate 16 between the device mechanism and electrical interconnect cavities 44 and 46. This second cavity is formed as a convenience in processing, and is not always necessary.

The second nearly hermetic cavity 46 contains the device mechanism electrical interconnect pads 18b of each of the laminated electrical conductors 18 that extend into the electrical interconnect window 30 in the LCP film 16a, and contains the package contact pads 22b at the ends of the device mechanism electrical traces 22 that extend into the electrical interconnect zone 26 of the base die mounting surface 20. The second electrical interconnect window 30 is optionally configured as several individual windows in the LCP film 16a, such as one window 30 for each of the device mechanism electrical interconnect pads 18b and the corresponding package contact pads 22b, without deviating from the scope and spirit of the invention. Furthermore, during thermocompression bonding together of the base and lid die 12, 14 by lamination with the LCP substrate 16, the second cavity 46 may be substantially obliterated by plastic flow of the LCP films 16a, 16b.

Optionally, the first device mechanism window 28 is expanded between the base and lid die 12, 14 to include the both the MEMS device mechanism mounting surface area or zone 24 of the base die mounting surface 20 and the electrical interconnect area or zone 26, whereby the electrical interconnect window 30 obviated. Accordingly, the first device mechanism cavity 44 and the second electrical interconnect cavity 46 are combined in a single nearly hermetic cavity that encompasses both the MEMS device mechanism mounting surface area or zone 24 of the base die mounting surface 20 and the electrical interconnect area or zone 26.

In practice of the chip carrier package 10, electrically conductive flip chip connections 48 are made between the device mechanism electrical interconnect pads 18b and corresponding package contact pads 22b. The flip chip connections 48 electrically couple the device mechanism electrical interconnect pads 18b to the corresponding package contact pads 22b for carrying signals into and out of the device mechanism cavity 44 substantially hermetically sealed within chip carrier package 10 of the invention.

Figure 3:
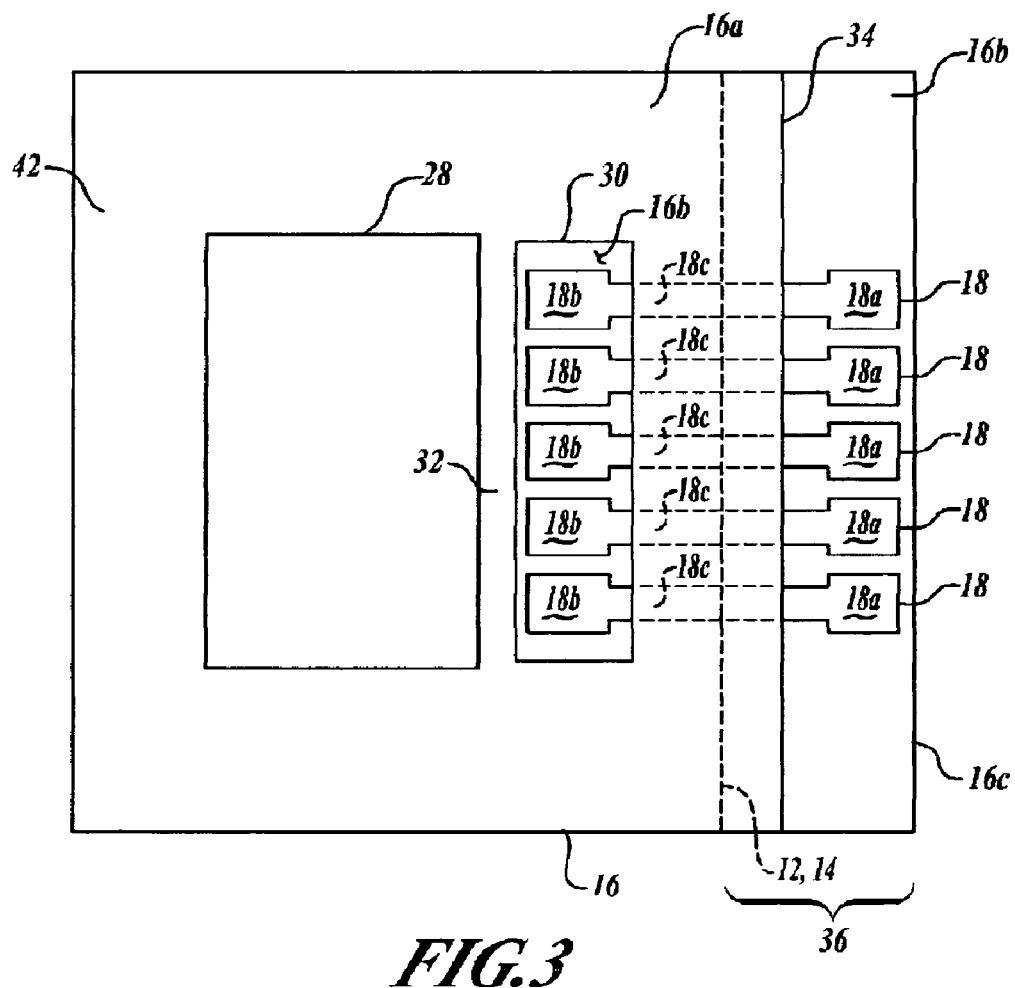
FIG. 3 is a plan view of the LCP substrate of the invention.

FIG. 3 is a plan view of the LCP substrate 16 of the invention. One of the LCP films 16a, 16b is patterned with an electrically conductive material, such as copper, aluminum, silver, gold and the like, to form the electrical conductors 18. The first and second LCP films 16a, 16b are laminated together with the metal electrical conductors 18 to form the LCP substrate 16. The first device mechanism window 28 is shown positioned at an interior portion of the LCP substrate 16 and surrounded by the window frame portion 42 of the LCP substrate 16. The second electrical interconnect window 30 is shown positioned at an interior portion of the LCP substrate 16 within the window frame portion 42 and spaced apart and mutually isolated from the device mechanism window 28 by the barrier or dam strip 32 of the LCP film 16a interposed therebetween. The third package interconnect window 34 is shown positioned at outside an outline of the base and lid die 12, 14 (indicated by dashed line), or at least outside the outline of the lid die 12, whereby the package interconnect pads 18a are accessible for wire bonding or other interconnection to an external circuit, such as a control or sensor circuit. Here, the third package interconnect window 34 is illustrated by example and without limitation as being positioned at or near the edge 16c of sheet or tape substrate 16.

The package interconnect pads 18a of the metal electrical conductors 18 are exposed on the shelf 38 of the second LCP film 16b exposed by the package interconnect window 34. The device mechanism electrical interconnect pads 18b are exposed on the second LCP film 16b through the second electrical interconnect window 30 cut in the LCP film 16a at the opposite end of the electrical conductors 18 from the package interconnect pads 18*a*. The elongated interconnect portion 18*c* of the metal electrical conductors 18 is laminated between the LCP films 16*a*, 16*b* between the second electrical interconnect window 30 and the third package interconnect window 34 in the LCP film 16*a*. The LCP substrate 16 is thus formed similarly to conventional flex tape substrates modified to accommodate the invention.

Figure 4:
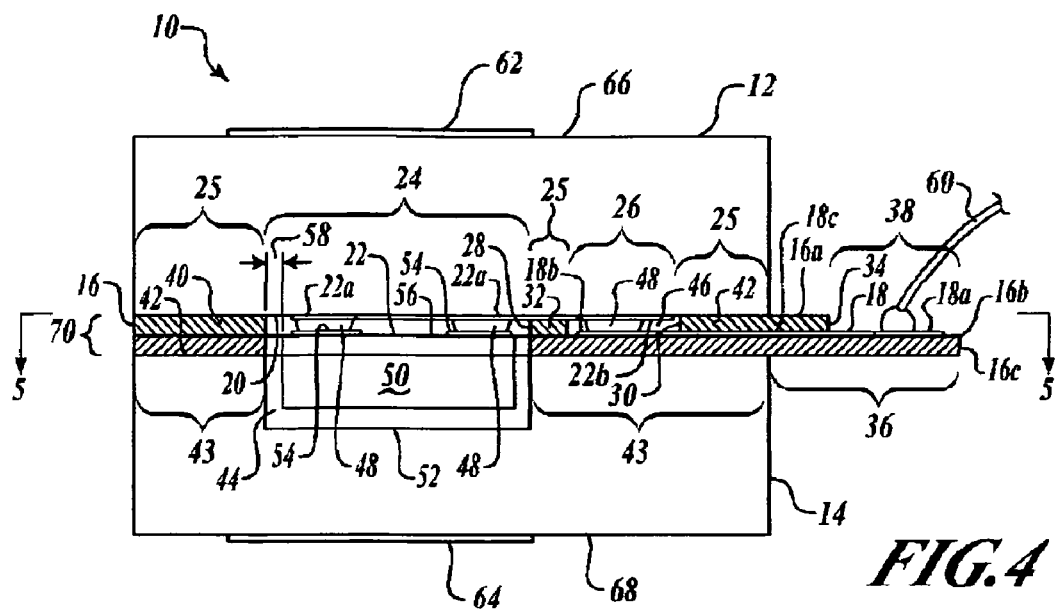
FIG. 4 is another cross-sectional view of the near hermetic chip carrier package of the invention illustrated in FIG. 1.

FIG. 4 is a cross-sectional view of the near hermetic chip carrier package 10 of the invention showing the base and lid die 12, 14 conjoined by the sheet or tape substrate 16 of LCP films 16*a*, 16*b* laminated over metal electrical conductors 18 for carrying signals into and out of package 10. Here, the near hermetic chip carrier package 10 of the invention is illustrated as further carrying a micro electromechanical system (MEMS) sensor or actuator device mechanism, such as a MEMS accelerometer, pressure transducer, or similar transducer mechanism 50. The nearly hermetic device mechanism cavity 44 for the MEMS device mechanism 50 is formed within the device mechanism window 28 formed in the LCP substrate 16 and between the base and lid die 12, 14. The semi-permeable LCP substrate layer 16 joining the base and lid die 12, 14 is kept to a minimum thickness, e.g., only a few thousands of an inch, so the space available for the MEMS device mechanism 50 is minimized. However, as illustrated here, the lid die 14 is optionally includes a complementary cavity 52 formed deep enough into the surface 40 to accommodate a taller device mechanism 50 and positioned to correspond to the MEMS device mechanism mounting surface area 24 interior of the base die mounting surface 20. The complementary cavity 52 is completely surrounded by the bonding zone portion 43 of the lid die surface 40.

During fabrication of the base die 12, mounting surface 20 is patterned with metal device mechanism electrical paths or traces 22 each having one of the device mechanism contact pads 22*a* positioned within the interior MEMS device mechanism mounting surface zone 24, and one or more of the electrical traces 22 having one of the package contact pads 22*b* positioned within the interior electrical interconnect zone 26.

The MEMS device mechanism 50 is formed with one or more flip chip bond pads 54 on its mounting surface 56 as is generally well-known in the art as disclosed, for example, by the inventor of the present invention in U.S. patent application Ser. No. 10/804,609, entitled "FLIP CHIP BONDED MICRO-ELECTROMECHANICAL SYSTEM (MEMS) DEVICE," filed March 18, 2004, and published Sep. 22, 2005, under publication number 2005/0205951, which is incorporated herein by reference. The MEMS device mechanism 50 communicates with the device mechanism contact pads 22*a* positioned on the opposing interior MEMS device mechanism mounting surface zone 24 of the base die 12 by means of a plurality of flip chip connections 48 provided as electrically conductive stud bumps coupled between chip bond pads 54 and device mechanism contact pads 22*a*.

The use of conductive stud bumps 48 on chip bond pads is well-known in the electronics industry for making electrical connections in microelectronic assemblies. See, e.g., U.S. Pat. No. 6,784,530 to Sugaya, which is incorporated herein by reference. Flip chip microelectronic assembly is the formation of direct electrical connection of face-down electronic components onto substrates, circuit boards, or carriers, by means of conductive bumps on chip bond pads. The flip chip technology, also known as Direct Chip Attach (DCA), replaces older wire bonding technology in semiconductor device assemblies which uses face-up chips with wire connections to the bond pads. Furthermore, wire bond connections are limited to the perimeter of the die, while flip chip connections can be made anywhere on the die. Flip chip electrical connections also accommodate three-dimensional stacking of die and other components.

Flip chip assemblies are made in three stages: the die or wafer is "bumped," the bumped die or wafer is attached to the board or substrate, and optionally, space remaining under the die is filled remaining with an electrically non-conductive material, e.g., an epoxy. Different kinds of flip chip assemblies are differentiated by the conductive bump, the attachment materials, and the processes used. Cost, space and performance constraints of the present invention are best suited by the well-known gold "stud bump" flip chip process. Here, the MEMS device mechanism 50 is "bumped" by placement of gold stud bumps 48 on the flip chip bond pads 54, and the bumped mechanism 50 is attached to the base die or wafer 12 by thermocompression bonding of gold stud bumps 48 to the complementary device mechanism contact pads 22*a*. Optionally, the mechanism 50 is "bumped" with one of many commonly available solder compounds, and attached to the cooperating flip chip bond pads 54 by solder reflow. Optionally, the space remaining under the MEMS device mechanism 50 is filled remaining with an electrically non-conductive material. Alternatively, the base die or wafer 12 is bumped with gold stud bumps 48 on the device mechanism contact pads 22*a*, and the bumped base die 12 is attached to the MEMS device mechanism 50 by thermocompression bonding of gold stud bumps 48 to the complementary flip chip bond pads 54. Additionally, the package contact pads 22*b* within the interior electrical interconnect zone 26 of the base die mounting surface 20 are bumped with gold stud bumps 48.

The LCP substrate 16 is formed with the two LCP films 16*a*, 16*b* laminated over the elongated interconnect portion 18*c* of the metal electrical conductors 18 such that the package interconnect pads 18*a* are exposed on the shelf 38 of the second LCP film 16*b* by the third package interconnect window 34, while the device mechanism electrical interconnect pads 18*b* are exposed in the second electrical interconnect window 30. The first device mechanism window 28 is cut or otherwise formed through the sheet or tape substrate 16 of LCP films 16*a*, 16*b* large enough to admit the MEMS device mechanism 50, and may include clearance space 58 there about to avoid interference with its operation.

The LCP substrate 16 is positioned over the mounting surface 20 of the base die 12 with the first device mechanism window 28 fit over the MEMS device mechanism 50 with the window frame portion 42 completely surrounding the MEMS device mechanism 50. When the clearance space 58 is present, the window frame portion 42 of LCP substrate 16 is optionally spaced away from the MEMS device mechanism 50 by the clearance space 58 completely there around. The second electrical interconnect window 30 is positioned over the interior electrical interconnect zone 26 of the base die mounting surface 20 with the complimentary device mechanism electrical interconnect pads 18*b* opposite from the corresponding package contact pads 22*b*, and with the electrically conductive gold stud bumps 48 interposed between the complimentary device mechanism electrical interconnect pads 18*b* and package contact pads 22*b*.

Conventional thermocompression bonding is used to attach the MEMS device mechanism 50 to the base die mounting surface 20 by means of the plurality of electrically conductive gold ball stud bumps 48. Simultaneously, thermocompression bonding takes place between the electrically conductive gold stud bumps 48 on package contact pads 22*b* and the complimentary device mechanism electrical interconnect pads 18*b* of the metal electrical conductors 18 laminated into the LCP substrate 16. Electrical communication is thereby accommodated between the MEMS device mechanism 50 and the package interconnect pads 18a through the electrically conductive gold ball stud bumps 48 interconnecting the respective internal electrically conductive paths or electrical conductors 22 of the base die 12 and the electrical conductors 18 of the LCP substrate 16. Electrical communication with the substantially hermetically sealed MEMS device mechanism 50 is thus accommodated through the coupling of electrical conductors 18 and 22. For example, wire bond connections are made to the package interconnect pads 18a exposed on the shelf 38 of LCP film 16b external of the substantially hermetically sealed device mechanism cavity 44. Remote electrical access is thereby provided to the MEMS device mechanism 50 via wire bonds 60 the external package interconnect pads 18a.

As is well known in the art and discussed in detail by the inventor of the present invention in co-pending U.S. patent application Ser. No. 10/804,609, is incorporated herein by reference, the electrically conductive gold stud bumps 48, are alternatively attached by conductive or non-conductive adhesives, or by thermocompressive, ultrasonic or thermosonic assembly without adhesive. Conductive adhesive may be isotropic, conducting in all directions, or anisotropic, conducting in a preferred direction only.

Isotropic conductive adhesives are well-known and well-characterized materials formed of an adhesive binder filled with conductive particles that are normally in contact with each other and provide minimal electrical resistance in all directions. Isotropic conductive adhesives are dispensed by stencil printing onto the base die chip bond pads 22a and 22b, or if the MEMS device mechanism 50 does not contain sensitive moving parts, the bumped die are dipped into a thin layer of adhesive, whereby only the bumps 48 are coated with adhesive.

Stenciled isotropic adhesive assembly is known to provide a larger quantity of adhesive than dipped assembly, whereby mechanically stronger bonds are formed. The additional adhesive compensates for minimal bump height variations. A panelized array of the bumped base die 12 may be simultaneously stenciled in one operation, which speeds assembly. The stenciled adhesive can be inspected or measured before die mount to insure uniformity. Stenciling requires a high-precision stencil printer and stencils which limits minimum pad pitch to about 90 microns, to allow adequate conductive adhesive transfer.

Dipping requires a thin, precisely controlled layer of adhesive, and co-planarity of the die and adhesive during the dipping process. Because dipping places adhesive only on the bump surface, the minimum bump spacing is smaller than for stenciling such that pad pitches of 60 microns or less may be utilized. Dipping does not require additional equipment as stenciling does because a die mount aligner-bonder can be used for dipping. However, dipping requires careful control of the adhesive layer thickness, and dipping is a serial process, which lengthens throughput time.

The isotropic conductive adhesive is heat cured, and thereafter the LCP substrate film 16 substantially fills the space between the base and lid die 12, 14. Laminating the LCP substrate 16 to the opposing base and lid die 12, 14 adds mechanical strength to the assembly and protects the connections from environmental hazards. Heat-curing the LCP substrate film 16 completes the assembly process.

Non-conductive adhesive assembly is in some ways similar to anisotropic adhesive assembly. A non-conductive adhesive is dispensed or stenciled at the die location on the base die 12. The bumped MEMS device mechanism 50 is pressed against the base die chip bond pads 22a with enough force give compressive dispersion of the adhesive, allowing no adhesive to remain between the mating surfaces of the stud bump 48 and base die chip bond pads 22a. This pressure is maintained during bake at an elevated temperature for sufficient time to at least partially cure the adhesive. The base and lid die 12, 14 are mechanically bonded to one another by the cured adhesive, with metal-to-metal contact between the bumps 48 and base die chip bond pads 22a. No separate under-fill adhesive is required. Rather, the LCP substrate film 16 joins the base and lid die 12, 14. However, adhesive improperly placed during assembly could interfere with moving parts of the device mechanism 50. Therefore, in contrast to semiconductor devices, thermocompressive or ultrasonic assembly is preferred when the MEMS device mechanism 50 is a sensor or actuator device having moving parts, such as a capacitive or vibrating beam acceleration sensor.

Thermocompressive, ultrasonic or thermosonic assembly eliminates the adhesive from MEMS device mechanism 50 that cannot tolerate adhesives against their active surfaces. Non-adhesive assembly for the gold stud bumped base die 12 is accomplished by pressing the bumped die 12 onto the gold chip bond pads 54 of the un-bumped MEMS device mechanism 50 and applying heat and pressure sufficient to form gold-to-gold metallic bonds between the stud bumps 48 and the gold chip bond pads 54. Optionally sonic energy is used in combination with the heat and pressure in an amount sufficient to form gold-to-gold metallic bonds between the stud bumps 48 and the gold chip bond pads 54 as in thermosonic wire bonding. When the stud bumps 48 are initially formed as gold balls in the range of about 50 to 75 micrometers tall, the heat, pressure, and sonic energy applied during ultrasonic assembly compresses the stud bumps 48 to about the thickness of the MEMS device mechanism 50. The stud bumps 48 are alternatively stacked, as is known in the art, to vary the resultant spacing. Thus, spacing between the device mechanism 50 and the opposing base die 12 is set in a controlled manner that will provide symmetric air gaps which tends to improves performance, particularly in vibration environments, in devices having moving parts, such as vibrating beam accelerometer sensors.

Heating the LCP substrate 16 causes it to melt and flow, which produces a bond between the LCP material and the glass, ceramic, silicon or metal base and lid die 12, 14. Therefore, additional thermocompression or other heating method is used to laminate the LCP substrate 16 to both the base and lid die 12, 14 for sealing the chip carrier package 10 with a nearly hermetic joint. Alternatively, heating the LCP substrate 16 is accomplished by any suitable means, including by example and without limitation using resistive heaters, infrared energy, laser energy, or other suitable heating devices and methods that effectively cause the LCP substrate 16 to melt and flow. Metal pads 62, 64 are optionally patterned on respective outside surfaces 66, 68 of the base and lid die 12, 14 for controlling where heating and resultant sealing occur when light is used as a heat source. The entire chip carrier package 10 is sealed simultaneously, or alternatively, the LCP substrate 16 is bonded first to the lid die 14, then to the base die 12, as a function of design and fabrication process flow efficiency.

Heating and subsequent plastic flow of the LCP substrate 16 and resultant adhesive bonding with the base and lid die 12, 14 seal the chip carrier package 10 of the invention with a nearly hermetic seal 70 between the base and lid die 12, 14. The MEMS device mechanism 50 is nearly hermetic sealed in the device mechanism cavity 44 between the base and lid die 12, 14 and within the confines of the window frame 42 of LCP material substrate 16. Remote electrical communication with the MEMS device mechanism 50 is provided by electrical signal paths 22 across the base die mounting surface 20 base die mounting surface 20 and through the laminated electrical conductors 18 to exposed package interconnect pads 18a. The surface area of the LCP substrate 16 able to pass atmosphere in the sealed package 10 is a tiny edge compared to the "bathtub" of the prior art LCP package. The overall package 10 is also much smaller than prior art LCP "bathtub" packages at least because internal wire bonds are completely eliminated.

Figure 5:
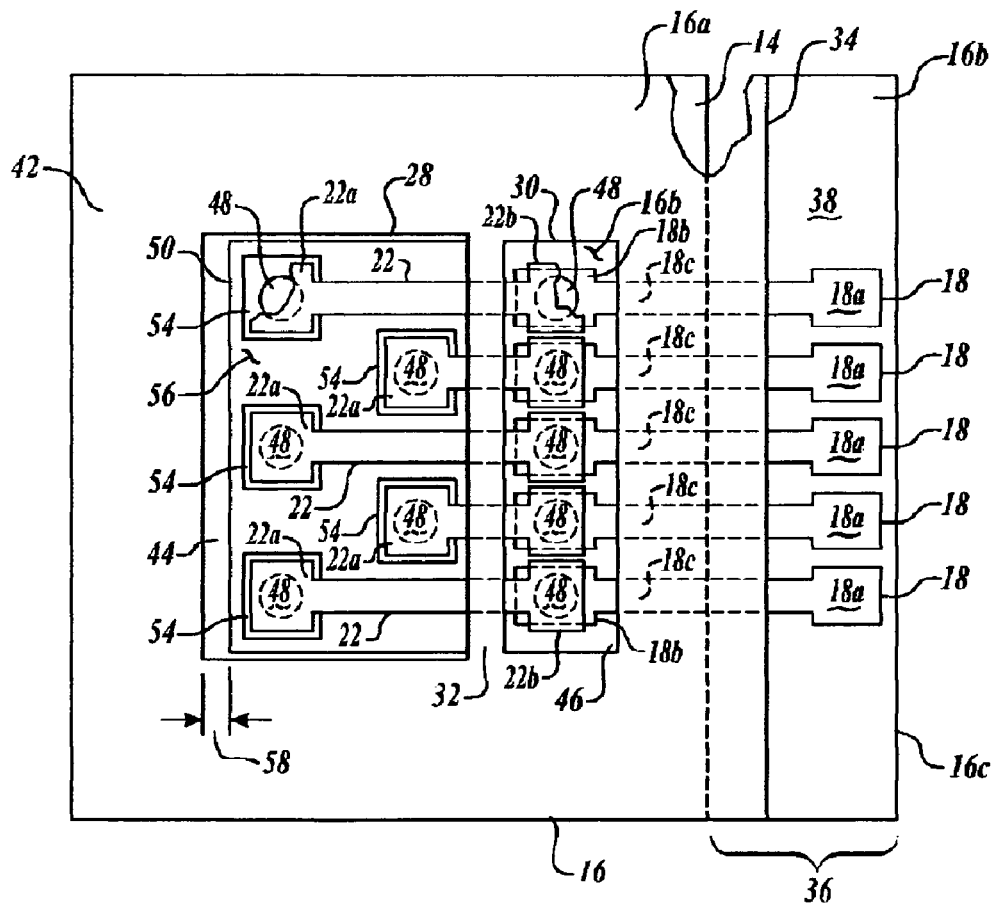
FIG. 5 is a cross-sectional view of the substantially hermetically sealed chip carrier package of the invention illustrated in FIG. 4.

FIG. 5 is a cross-sectional view of the substantially hermetically sealed chip carrier package 10 of the invention taken between the base die 12 and electrical conductors 22 formed thereon. As illustrated here, the device mechanism contact pads 22a of the base die electrical conductors 22 overlap complementary flip chip bond pads 54 on the mounting surface 56 of the MEMS device mechanism 50, and flip chip connections 48 are formed therebetween. The package contact pads 22b at opposite ends of the base die electrical conductors 22 from the device mechanism contact pads 22a overlap complementary device mechanism electrical interconnect pads 18b of the electrical conductors 18 within the sealed cavity 46 formed by the electrical interconnect window 30 in the LCP film 16a (shown) or 16b of sheet or tape substrate 16 against the bonding area 25 of the base die mounting surface 20 (shown in FIG. 4). Flip chip connections 48 are formed between package contact pads 22b and complementary device mechanism electrical interconnect pads 18b.

The MEMS device mechanism 50 is nested inside the nearly hermetic device mechanism cavity 44 formed between the base and lid die 12, 14 and within the device mechanism window 28 formed in the LCP substrate 16. The window frame portion 42 of the LCP substrate 16 completely surrounds the MEMS device mechanism 50, though a clearance space 58 may be provided there about to avoid interference with its operation. The window frame portion 42 of the LCP substrate 16 completely seals the base and lid die 12, 14 around the device mechanism cavity 44 and the MEMS device mechanism 50 nested inside.

The package interconnect pad 18a portion of each of the metal electrical conductors 18 is provided on the exposed shelf 38 of the second LCP film 16b. The elongated interconnect portion 18c of the electrical conductors 18 is laminated between the LCP films 16a, 16b of the semi-permeable sheet or tape LCP substrate 16. The elongated interconnect portion 18c interconnects the device mechanism electrical interconnect pad 18b within the sealed cavity 46 with the corresponding package interconnect pad 18a at the opposite end of each electrical conductor 18. The package interconnect pad 18a provide remote electrical communications with the sealed MEMS device mechanism 50.

While the preferred embodiment of the invention has been illustrated and described, it will be appreciated that various changes can be made therein without departing from the spirit and scope of the invention.

What is claimed is:

1. A chip carrier package, comprising:
   first and second die;
   at least one first electrical conductor provided on a mounting surface of the first die and extending between a first end positioned in a first interior portion of the mounting surface and a second end positioned at a second interior portion of the mounting surface;
   a thermoplastic substrate bonded between the mounting surface of the first die and an opposing surface of the second die and forming a substantially sealed cavity between the mounting surface of the first die and the opposing surface of the second die in a position corresponding to the first interior portion of the mounting surface of the first die, and forming a surface external of the first and second die; and
   at least one second electrical conductor extending between a first end positioned on the surface of the substrate external of the first and second die and a second end coupled to the second end of the first electrical conductor.

2. The package of claim 1 wherein the second interior portion of the mounting surface is positioned remotely from the first interior portion.

3. The package of claim 2, further comprising a flip chip connection coupling the second end of the second electrical conductor and the second end of the first electrical conductor.

4. The package of claim 3, further comprising a sealed cavity in a position corresponding to the connection between the second end of the second electrical conductor and the second end of the first electrical conductor.

5. The package of claim 1 wherein the thermoplastic substrate further comprises a substrate formed of a thermotropic liquid crystal polymer (LCP).

6. The package of claim 5 wherein the thermoplastic substrate further comprises a substrate formed of two or more thermotropic liquid crystal polymer (LCP) films laminated over at least a portion of the second electrical conductor extending between the first end and the second end.

7. The package of claim 6 wherein the surface of the substrate further comprises a surface of a second one of the films that is exposed by a window formed in a first one of the films.

8. The package of claim 1, further comprising a micro electro-mechanical system (MEMS) device mechanism being positioned within the sealed cavity and being attached to the first end of the first electrical conductor.

9. The package of claim 8 wherein the sealed cavity further comprises a cavity formed in the surface of the second die opposite from the first interior portion of the mounting surface of the first die.

10. A chip carrier package, comprising:
    a first die formed of a substantially impermeable material and being formed with a substantially planar mounting surface having a peripheral bonding surface;
    a plurality of first metallic electrical conductors provided on the mounting surface of the first die, one or more of the electrical conductors having a first contact pad positioned at a first interior portion of the mounting surface completely surrounded by the peripheral bonding surface, and a second contact pad positioned at a second interior portion of the mounting surface remote from the first interior portion and completely surrounded by the peripheral bonding surface;
    a second die formed of a substantially impermeable material and being formed with a substantially planar surface having a peripheral bonding surface, the second die being spaced from the first die with the surface facing toward the mounting surface of the first die, and the peripheral bonding surface of the surface of the second die substantially aligned with the peripheral bonding surface of the first die;
    a thermoplastic substrate bonded between the opposing peripheral bonding surfaces of the first and second die and forming a seal therebetween, the substrate being formed of at least first and second thermoplastic films and further comprising: a first window formed through the first and second films in a position substantially corresponding to the first interior portion of the mounting surface of the first die and completely surrounded by the seal, a second window formed in one of the first and second films and exposing an interior surface of the thermoplastic substrate in a position substantially corresponding to the second interior portion of the mounting surface of the first die, and a third window formed in one of the first and second films and exposing an interior surface of the thermoplastic substrate in a position external of the seal;

a plurality of second electrical conductors each comprising: an elongated portion sealed between the films of the substrate, a first contact pad extended onto the interior surface of the of the thermoplastic substrate external of the seal, and a second contact pad extended onto the interior surface of the of the thermoplastic substrate in a position opposite from and spaced away from the second contact pad of a corresponding one of the plurality of first metallic electrical conductors positioned at the second interior portion of the mounting surface; and an electrical connection formed between the second end of at least one of the plurality of electrical conductors and the second contact pad of the corresponding one of the plurality of first metallic electrical conductors.

11. The package of claim 10 wherein the thermoplastic films of the substrate each further comprises a thermotropic liquid crystal polymer (LCP) film.

12. The package of claim 11 wherein the first and second windows are both formed in the first thermoplastic film, and the interior surface of the thermoplastic substrate is formed by the second thermoplastic film.

13. The package of claim 10 wherein the electrical connection formed between the second end of at least one of the plurality of electrical conductors and the second contact pad of the corresponding one of the plurality of first metallic electrical conductors further comprises a flip chip stud bump connection.

14. The package of claim 10, further comprising a micro electro-mechanical system (MEMS) device mechanism in a cavity formed by the first window formed through the first and second films in combination with the first interior portion of the mounting surface of the first die and a corresponding portion of the surface of the second die interior of the peripheral bonding surface.

15. The package of claim 14, further comprising a cavity formed in the surface of the second die completely surrounded by the peripheral bonding surface, the cavity being opposite from the first interior portion of the mounting surface of the first die and joined with the cavity.

16. A method for fabricating a chip carrier package, the method comprising:

forming a base die of a substantially impermeable material and having a substantially planar mounting surface;

forming a plurality of first electrical conductors on the mounting surface of the base die, one or more of the electrical conductors having a first contact pad positioned at a first interior portion of the mounting surface, and a second contact pad positioned at a second interior portion of the mounting surface remote from the first interior portion;

forming a cover die of a substantially impermeable material and having a substantially planar surface;

spacing the cover die from the base die with the surface opposing the mounting surface of the base die with an interior portion of the surface of the cover die substantially aligned with the first interior portion of the mounting surface of the base die;

in a thermoplastic substrate, forming a first window fully through the thermoplastic substrate in a position substantially corresponding to the first interior portion of the mounting surface of the base die, forming a second window partially through the through the thermoplastic substrate and exposing therein a first interior surface thereof in a position substantially corresponding to the second interior portion of the mounting surface of the base die, and forming a third window partially through the through the thermoplastic substrate in a position remote from the first and second windows and exposing therein a second interior surface of the thermoplastic substrate;

partially sealing a second electrical conductor within the thermoplastic substrate, including exposing a first contact pad of the second electrical conductor on the second interior surface of the thermoplastic substrate and exposing a second contact pad on the first interior surface of the of the thermoplastic substrate;

positioning the thermoplastic substrate between the mounting surface of the base die and the opposing surface of the cover die with the first window formed fully through the thermoplastic substrate in a position substantially aligned with the first interior portion of the mounting surface of the base die, the second window formed partially through the through the thermoplastic substrate in a position substantially aligned with the second interior portion of the mounting surface of the base die and the second contact pad of the second electrical conductor substantially aligned with the second contact pad of a corresponding one of the plurality of first electrical conductors formed on the mounting surface of the base die, and the third window formed partially through the through the thermoplastic substrate in a position external of both the base and cover die;

forming an electrical connection between the second end of the second electrical conductor and the second contact pad of the corresponding one of the plurality of first metallic electrical conductors; and forming a seal between the base and cover die at least completely surrounding the first window formed fully through the thermoplastic substrate.

17. The method of claim 16 wherein forming an electrical connection between the second end of the second electrical conductor and the second contact pad of the corresponding one of the plurality of first metallic electrical conductors further comprises forming a flip chip stud bump connection.

18. The method of claim 16, further comprising forming the thermoplastic substrate laminating together two or more thermoplastic films with a portion of the second electrical conductor sealed therebetween.

19. The method of claim 16 wherein forming a seal between the base and cover die further comprises heating the thermoplastic substrate.

20. The method of claim 16, further comprising attaching a micro electro-mechanical system (MEMS) device mechanism to the first interior portion of the mounting surface of the base die within the first window formed fully through the thermoplastic substrate and completely surrounded by the seal between the base and cover die.

* * * * *